(12) United States Patent
Liu et al.

(10) Patent No.: US 12,292,633 B2
(45) Date of Patent: May 6, 2025

(54) DISPLAY DEVICE

(71) Applicants: Beijing BOE Display Technology Co., Ltd., Beijing (CN); BOE Technology Group Co., Ltd., Beijing (CN)

(72) Inventors: Miao Liu, Beijing (CN); Huiyan Li, Beijing (CN); Fuxue Liang, Beijing (CN); Yu Zhang, Beijing (CN); Xuefei Qin, Beijing (CN); Zhuolong Li, Beijing (CN); Liang Bo, Beijing (CN); Lulu Wang, Beijing (CN); Shixin Geng, Beijing (CN); Fan Yang, Beijing (CN); Jingrui Ren, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/247,035

(22) PCT Filed: May 10, 2022

(86) PCT No.: PCT/CN2022/092026
§ 371 (c)(1),
(2) Date: Mar. 28, 2023

(87) PCT Pub. No.: WO2023/216110
PCT Pub. Date: Nov. 16, 2023

(65) Prior Publication Data
US 2024/0361629 A1    Oct. 31, 2024

(51) Int. Cl.
*G02F 1/1333*    (2006.01)
*G02F 1/13357*    (2006.01)
(Continued)

(52) U.S. Cl.
CPC .. *G02F 1/133314* (2021.01); *G02F 1/133317* (2021.01); *G02F 1/133325* (2021.01);
(Continued)

(58) Field of Classification Search
CPC ......... G02F 1/133615; G02F 1/133314; G02F 1/133325; G02F 1/133317; G02F 1/1339
See application file for complete search history.

(56) References Cited

U.S. PATENT DOCUMENTS

2006/0268194 A1    11/2006    Morimoto et al.
2014/0061405 A1     3/2014    Lee
(Continued)

FOREIGN PATENT DOCUMENTS

CN    202182991 U     4/2012
CN    202548471 U    11/2012
(Continued)

*Primary Examiner* — Mariceli Santiago
(74) *Attorney, Agent, or Firm* — Workman Nydegger

(57) ABSTRACT

The present disclosure provides a display device. The display device includes: a display panel including an display area and a peripheral area surrounding the display area; a backlight module at a light incident side of the display panel; where the backlight module includes a backplane, a light guide plate and a plurality of light strips, the backplane includes a first polygonal bottom plate, and a plurality of first side plates connected to the first bottom plate at an edge of the first bottom plate, the light guide plate is located between the first bottom plate and the display panel, and the light strips are located between the first side plates and the light guide plate; and an assembly frame assembled to the display panel and the backlight module at an edge of the display panel and an edge of the backlight module.

20 Claims, 10 Drawing Sheets

(51) Int. Cl.
 *G02F 1/1339* (2006.01)
 *H05K 1/18* (2006.01)
(52) U.S. Cl.
 CPC ...... *G02F 1/133615* (2013.01); *G02F 1/1339* (2013.01); *H05K 1/189* (2013.01); *H05K 2201/10136* (2013.01)

(56) References Cited

U.S. PATENT DOCUMENTS

| | | |
|---|---|---|
| 2014/0204310 A1 | 7/2014 | Lee et al. |
| 2017/0153485 A1 | 6/2017 | Kim |
| 2018/0031898 A1* | 2/2018 | Tanaka .............. G02F 1/133308 |
| 2018/0247582 A1 | 8/2018 | Park et al. |
| 2020/0258969 A1 | 8/2020 | Yi et al. |
| 2020/0303669 A1 | 9/2020 | Hu et al. |
| 2021/0373384 A1 | 12/2021 | Geng et al. |

FOREIGN PATENT DOCUMENTS

| | | | |
|---|---|---|---|
| CN | 103002702 A | 3/2013 | |
| CN | 103969868 A | 8/2014 | |
| CN | 204203579 U | 3/2015 | |
| CN | 106873214 A | 6/2017 | |
| CN | 107390431 A * | 11/2017 | ....... G02F 1/133615 |
| CN | 108508968 A | 9/2018 | |
| CN | 109449187 A | 3/2019 | |
| CN | 109613738 A | 4/2019 | |
| CN | 110729333 A | 1/2020 | |
| CN | 111554708 A | 8/2020 | |
| CN | 112051639 A * | 12/2020 | ........... G02B 6/0025 |
| CN | 113744667 A | 12/2021 | |

* cited by examiner

DISPLAY DEVICE

CROSS-REFERENCE TO RELATED APPLICATIONS

The disclosure is a National Stage of International Application No. PCT/CN2022/092026, filed on May 10, 2022, which is hereby incorporated by reference in their entireties.

FIELD

The present disclosure relates to the technical field of display, in particular to a display device.

BACKGROUND

As displays have been applied to increasing fields over time, users make growing demands for a special shape of screens, for example, a circular shape, instead of a conventional shape, for example, a quadrangle. However, circular displays in the prior art have large bezels, affecting display effects.

SUMMARY

An embodiment of the present disclosure provides a display device. The display device includes:
- a display panel including a display area and a peripheral area surrounding the display area;
- a backlight module at a light incident side of the display panel; where the backlight module includes a backplane, a light guide plate and a plurality of light strips; the backplane includes a first polygonal bottom plate, and a plurality of first side plates connected to the first bottom plate at an edge of the first bottom plate; the light guide plate is located between the first bottom plate and the display panel; and the light strips are located between the first side plates and the light guide plate; and
- an assembly frame assembled to the display panel and the backlight module at an edge of the display panel and an edge of the backlight module, where a shape of an outer contour of the assembly frame is a circle.

In some embodiments, the assembly frame includes:
- a first assembly frame including a front plate and a second side plate connected to the front plate at an edge of the front plate; where the front plate covers part of the peripheral area at a side, facing away from the backlight module, of the display panel; and the second side plate is opposite to a side surface of the display panel and a side surface of the backlight module; and
- a second assembly frame including a second bottom plate between the backlight module and the display panel, and a third side plate connected to the second bottom plate at an edge of the second bottom plate; where the third side plate is located between the second side plate and the first side plate in a connection area of two adjacent first side plates.

In some embodiments, a shape of the display area is a circle; and
(R2−R1)/R1 is greater than or equal to 0.045 and less than or equal to 0.114, where R1 represents a radius of the display area, and R2 represents a distance between a center of the display area and an outer contour of the first assembly frame.

In some embodiments, the backplane further includes:
a plurality of first connectors that are integrally connected to the first side plates outside a joint of two adjacent first side plates and are configured for fixation to the assembly frame.

In some embodiments, the first connector includes a first connection portion parallel to a plane where the first bottom plate is located;
the first connection portion includes a first opening; and
the first assembly frame includes first rivet studs corresponding to the first openings in a one-to-one manner, and the first rivet stud is fixed to the first connection portion through a first screw in an area of the first opening.

In some embodiments, the second assembly frame further includes a second opening at least avoiding an opening of the first rivet stud.

In some embodiments, the first connection portion is connected to the first side plate.

In some embodiments, the first connector further includes a second connection portion and a third connection portion, the third connection portion is connected to the first side plate, two ends of the second connection portion are connected to the third connection portion and the first connection portion respectively, the first connection portion is parallel to the third connection portion, and the second connection portion is parallel to the first side plate.

In some embodiments, the third connection portion includes a third opening; and the second assembly frame includes threaded openings corresponding to the third openings in a one-to-one manner, and the third connection portion is fixed to the second assembly frame through a second screw in an area of the third opening and the threaded opening.

In some embodiments, the first connector includes: the first connection portion that is parallel to the plane where the first bottom plate is located and connected to the first side plate, and a first buckle at a side, close to the second assembly frame, of the first connection portion; and
the second assembly frame includes first buckling openings corresponding to the first buckles in a one-to-one manner, and the first buckle is buckled to the second assembly frame at the first buckling opening.

In some embodiments, the display device includes a plurality of chip-on-film circuit boards, where the chip-on-film circuit boards are bent along the first side plates; and
the first connectors are merely connected to first side plates that do not correspond to a chip-on-film circuit board.

In some embodiments, the display device includes K second printed circuit boards, K is an integer greater than 1 and less than N, and N is the number of sides of the first bottom plate, where each of the second printed circuit boards is connected to at least one chip-on-film circuit board, and each of the second printed circuit boards corresponds to one first side plate; and
the backplane includes N-K first connectors.

In some embodiments, the backplane further includes:
a plurality of second connectors connected to the first side plates corresponding to the chip-on-film circuit boards in an area other than bent areas of the chip-on-film circuit boards, and the second connectors are configured for fixation to the first assembly frame.

In some embodiments, the second connector includes: a fourth connection portion in bent connection to the first side plate, and a fifth connection portion connected to the fourth connection portion;
the fifth connection portion has a fourth opening; and
the first assembly frame has second rivet studs that correspond to the fourth openings in a one-to-one manner and penetrate the fourth openings, and in the fourth opening, the second rivet stud is fixed to the second connector through a third screw; and
the second assembly frame has a fifth opening avoiding the second rivet stud.

In some embodiments, the first side plate includes at least one first bent portion bent towards a side of the light strip, and the light strip is located between the first bent portion and the first bottom plate.

In some embodiments, the display panel includes a plurality of straight sides and a plurality of cambered sides; and
the display device further includes: a plurality of chip-on-film circuit boards bonded to the display panel at a portion, corresponding to at least part of the straight sides, of the peripheral area.

In some embodiments, two chip-on-film circuit boards are bonded to the portion, corresponding to at least part of the straight sides, of the peripheral area.

In some embodiments, only one chip-on-film circuit board is bonded to the portion, corresponding to at least part of the straight sides, of the peripheral area.

In some embodiments, the number N of sides of the first bottom plate satisfies a condition as follows:

$$\tan^{-1}\left(\frac{nL3 + (n-1)L4}{2(R1 + L1)}\right) \leq \frac{\pi}{N},$$

where N represents an integer rounded down; L3 represents a width of the chip-on-film circuit board in an extension direction of the straight side, n represents the number of chip-on-film circuit boards bonded to one straight side, and L4 represents a gap between adjacent chip-on-film circuit boards bonded to one straight side.

In some embodiments, the display device further includes a plurality of converters, and each of the converters is electrically connected to even-numbered light strips.

In some embodiments, the display device includes two converters, the light strips correspond to the first side plates in a one-to-one manner, and the number N of sides of the first bottom plate is a multiple of 4.

In some embodiments, the display device further includes a plurality of second printed circuit boards bonded to the chip-on-film circuit boards;
where the chip-on-film circuit boards penetrate a gap between the first assembly frame and the second assembly frame to bend towards a side, facing away from the display panel, of the backplane;
the backplane has a plurality of first recesses recessed towards a side of the display panel, and the first recesses accommodate the second printed circuit boards;
the display device further includes cover members that cover the second printed circuit boards and the chip-on-film circuit boards at the side, facing away from the display panel, of the backplane;
the second assembly frame includes alignment marks corresponding to the cover members in a one-to-one manner; and
the alignment mark includes two alignment mark lines parallel to a pair of sides of the cover member respectively, and the pair of sides of the cover member overlap the alignment mark lines.

In some embodiments, the cover member is stuck to the second assembly frame and the backplane through an adhesive material; and
a thickness of the adhesive material between the second assembly frame and the cover member is greater than a thickness of an adhesive material between the backplane and the cover member.

In some embodiments, the adhesive material includes a first adhesive material stuck to the cover member and a second adhesive material at a side, facing away from the cover member, of the first adhesive material; and
the second adhesive material is at least stuck to the second assembly frame.

In some embodiments, the display device further includes: a controller assembled to the backplane at the side, facing away from the display panel, of the backplane, and a plurality of flexible printed circuit boards; where an end of the flexible printed circuit board is connected to the controller, and the other end of the flexible printed circuit board is connected to the second printed circuit board; and
the flexible printed circuit board is stuck to the backplane through a third adhesive material.

in some embodiments, at a side facing away from the display panel, the first bottom plate further includes: an annular protrusion, a pair of first strip-shaped protrusions arranged oppositely, and a pair of second strip-shaped protrusions arranged oppositely; where a center of the annular protrusion coincides with the center of the display area, the first strip-shaped protrusions intersect with the second strip-shaped protrusions, the annular protrusion is located between the pair of first strip-shaped protrusions arranged oppositely, and the annular protrusion is located between the pair of second strip-shaped protrusions arranged oppositely; and
the display device further includes: an annular reinforcing rib at a side, facing away from the display panel, of the annular protrusion; a first strip-shaped reinforcing rib at a side, facing away from the display panel, of the first strip-shaped protrusion; and a second strip-shaped reinforcing rib at a side, facing away from the display panel, of the second strip-shaped protrusion.

In some embodiments, the display device further includes:
a mirror cover plate at a side, facing away from the display panel of the front plate.

In some embodiments, the display device further includes:
a first optical film between the front plate and the display panel;
a frame sealant connecting the front plate to the first optical film at an edge of a side, close to the display area, of the front plate; and
an adhesive glue between the first optical film and the mirror cover plate in an area encircled by the front plate.

BRIEF DESCRIPTION OF THE DRAWINGS

To describe technical solutions of embodiments of the present disclosure more clearly, accompanying drawings required for description of the embodiments will be briefly described below. Apparently, the accompanying drawings in the following description are merely some embodiments of the present disclosure, and a person of ordinary skill in the art can derive other accompanying drawings from these accompanying drawings without creative efforts.

DETAILED DESCRIPTION OF THE EMBODIMENTS

Figure 1:
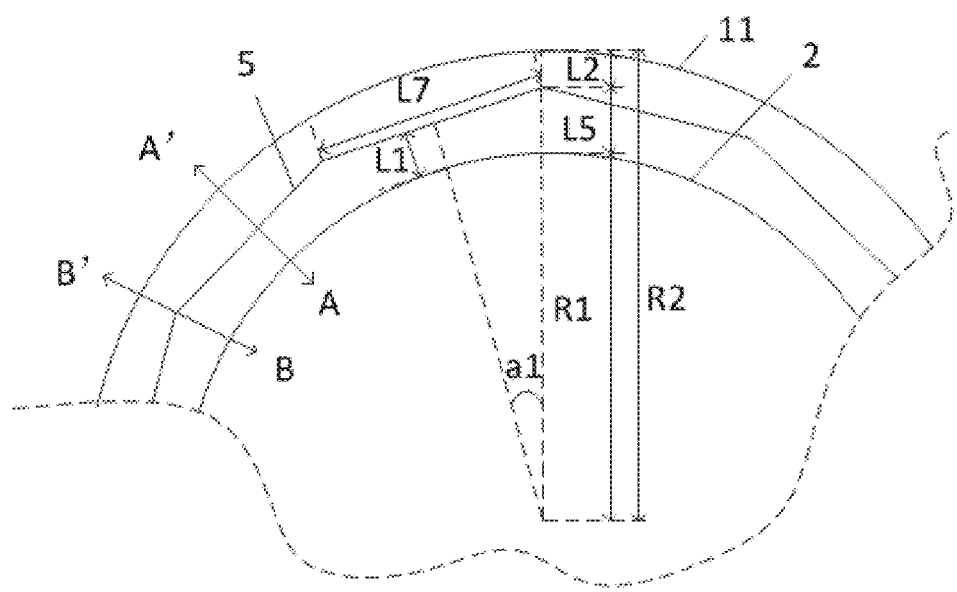
FIG. 1 is a schematic structural diagram of a display device according to an embodiment of the present disclosure.

In order to make objectives, technical solutions and advantages of embodiments of the present disclosure clearer, the technical solutions of the embodiments of the present disclosure will be clearly and completely described with reference to accompanying drawings of the embodiments of the present disclosure. Apparently, the described embodiments are some embodiments rather than all embodiments of the present disclosure. In addition, the embodiments in the present disclosure and features in the embodiments can be combined mutually in the case of no conflict. All other embodiments derived by a person of ordinary skill in the art from the described embodiments of the present disclosure without creative efforts shall fall within the protection scope of the present disclosure.

Unless otherwise defined, technical terms or scientific terms used in the present disclosure should have ordinary meanings understandable by a person of ordinary skill in the field to which the present disclosure belongs. Words such as "first" and "second" used in the present disclosure do not denote any order, quantity, or importance, but are merely used to distinguish between different components. Words such as "comprise", "include" or "encompass" are intended to mean that an element or item in front of the word encompasses elements or items that are present behind the word and it equivalents, but does not exclude other elements or items. Words such as "connection" and "connected" are not limited to physical or mechanical connections, but can include an electrical connection that is direct or indirect.

It should be noted that a size and a shape of each figure in the accompanying drawings do not reflect true scales, and are merely intended to illustrate contents of the present disclosure.

Identical or similar reference numerals denote identical or similar elements or elements having identical or similar functions throughout.

Figure 2:
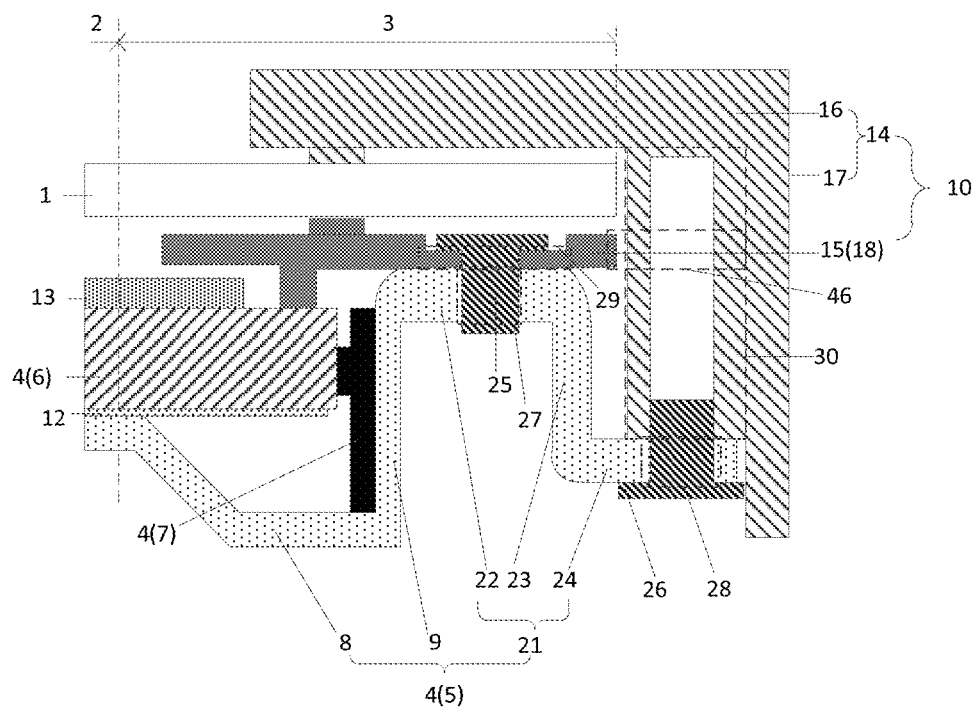
FIG. 2 is a schematic diagram of a section along AA' in FIG. 1 according to an embodiment of the present disclosure.
Figure 3:
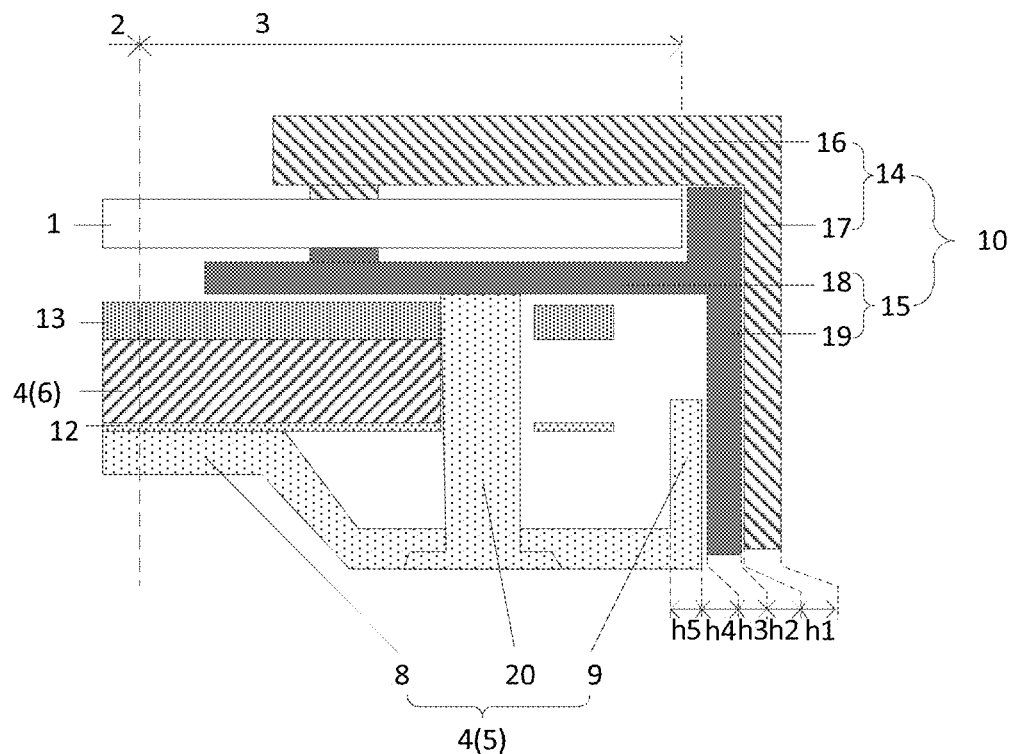
FIG. 3 is a schematic diagram of a section along BB' in FIG. 1 according to an embodiment of the present disclosure.

The embodiments of the present disclosure provide a display device. As shown in FIGS. 1, 2 and 3, the display device includes:

a display panel 1 including a display area 2 and a peripheral area 3 surrounding the display area 2;

a backlight module 4 located at a light incident side of the display panel 1 and including a backplane 5, a light guide plate 6 and a plurality of light strips 7; where the backplane 5 includes a first polygonal bottom plate 8, and a plurality of first side plates 9 connected to the first bottom plate 8 at an edge of the first bottom plate 8; the light guide plate 6 is located between the first bottom plate 8 and the display panel 1; and the plurality of light strips 7 are located between the plurality of first side plates 9 and the light guide plate 6; and an assembly frame 10 assembled to the display panel 1 and the backlight module 4 at an edge of the display panel 1 and an edge of the backlight module 4, where a shape of an outer contour 11 of the assembly frame 10 is a circle.

In the display device according to the embodiments of the present disclosure, the backplane includes the first polygonal bottom plate, such that a distance between the display area and the outer contour of the assembly frame is reduced by increasing the number of sides of the first bottom plate, a size of a bezel is reduced, and a display effect is improved.

It should be noted that FIG. 2 is a sectional view along AA' in FIG. 1, and FIG. 3 is a sectional view along BB' in FIG. 1. FIG. 1 merely shows part of areas of the display device, and merely shows an orthographic projection relation among the display area 2, a contour of the polygonal backplane 5 and the outer contour 11 of the assembly frame.

It should be noted that the outer contour of the assembly frame is a contour of the display device, and the corresponding contour of the display device is circular, that is, the display device according to the embodiments of the present disclosure is a circular display device.

In some embodiments, the display panel is a liquid crystal display panel. The liquid crystal display panel includes an array substrate and an opposite substrate that are arranged oppositely, and a liquid crystal layer between the array substrate and the opposite substrate.

During specific implementation, the display area of the liquid crystal display panel includes a plurality of sub-pixels. The array substrate includes a first base substrate and pixel circuits that are arranged on the first base substrate and correspond to the sub-pixels in a one-to-one manner. Each pixel circuit includes a thin-film transistor and a pixel electrode electrically connected to the thin-film transistor; and the thin-film transistor includes an active layer, a gate, a source and a drain. The array substrate further includes a plurality of scanning lines and data lines intersecting horizontally and vertically, the plurality of scanning lines and data lines divide areas of the sub-pixels, the gates of the thin-film transistors are electrically connected to the scanning lines, the sources of the thin-film transistors are electrically connected to the data lines, and the drains of the thin-film transistors are electrically connected to the pixel electrodes. During specific implementation, the scanning line is used to input a scanning signal, the data line is used to input a data signal, and when the thin-film transistor is turned on under control of the scanning signal provided by the scanning line, the data signal input by the data line may be transmitted to the pixel electrode through the thin-film transistor. During specific implementation, the thin-film transistor may be a top-gate structure, that is, the gate is located between the active layer and the source-drain. Correspondingly, the array substrate further includes a buffer layer between the first base substrate and the active layer, a first gate insulation layer between the active layer and the gate, an interlayer insulation layer between the first gate insulation layer and the source-drain, and a passivation layer between the source-drain and the pixel electrode. The active layer is provided with a source contact area, a drain contact area and a semiconductor area between the source contact area and the drain contact area; the source is connected to the source contact area by penetrating a via hole of the interlayer insulation layer and a via hole of the first gate insulation layer, the drain is connected to the drain contact area by penetrating the via hole of the interlayer insulation layer and the via hole of the first gate insulation layer, and the pixel electrode is electrically connected to the drain by penetrating a via hole of the passivation layer. Or, the thin-film transistor may be a bottom-gate structure, that is, the active layer is located between the gate and the source-drain; and the array substrate further includes a buffer layer between the first base substrate and the gate, a first gate insulation layer between the gate and the active layer, and a passivation layer between the source-drain and the pixel electrode. The source and the drain are in direct contact with the active layer, and the pixel electrode is electrically connected to the drain by penetrating a via hole of the passivation layer. The plurality of sub-pixels include, for example, a plurality of red sub-pixels, a plurality of blue sub-pixels and a plurality of green sub-pixels. The opposite substrate includes, for example, a second base substrate; a light shielding layer located at a side, facing the liquid crystal layer, of the base second substrate; and a plurality of chromatic color resists. The light shielding layer includes opening areas corresponding to the sub-pixels in a one-to-one manner; the chromatic color resists are located in the opening areas; and the plurality of chromatic color resists include a plurality of red color resists, a plurality of blue color resists and a plurality of green color resists. The array substrate or the opposite substrate further includes a common electrode. In the case that the array substrate includes the common electrode, the common electrode is located, for example, at a side, facing the liquid crystal layer, of the pixel electrode; or the common electrode is located between the pixel electrode, and the source-drain. In the case that the opposite substrate includes the common electrode, the common electrode is located, for example, at a side, facing the liquid crystal layer, of the chromatic color resists.

During specific implementation, a side, close to the liquid crystal layer, of the array substrate and a side, close to the liquid crystal layer, of the opposite substrate further include an alignment layer each, that is, the liquid crystal layer is located between the alignment layer of the array substrate and the alignment layer of the opposite substrate. The alignment layer of the array substrate and the alignment layer of the opposite substrate are used to align liquid crystal molecules in the liquid crystal layer, such that the liquid crystal molecules have a specific arrangement. During specific implementation, for example, by applying a signal to the common electrode and the pixel electrode, the arrangement of the liquid crystal molecules in the liquid crystal layer may be changed under the action of an electric field. That is, deflection of liquid crystal may be controlled by the electric field formed by the common electrode and the pixel electrode. During specific implementation, the common electrode may be set on the whole surface, that is, signals applied to the common electrode corresponding to different sub-pixels are the same, light transmittance of liquid crystal layers corresponding to different sub-pixels may be not exactly the same by applying signals that are not exactly the same to the pixel electrodes, such that the sub-pixels have gray scales that are not exactly the same.

In some embodiments, as shown in FIG. 1, a shape of the display area 2 is a circle, It should be noted that in the display device according to the embodiments of the disclosure, the light strips are located between the light guide plate and the first side plate, that is, a light source of the display device is edge-lit. For the edge-lit light source, light emitted by the light strips enter from a light incident surface of a side, close to the light strips, of the light guide plate; and the light enters the light guide plate to be reflected and diffused, and then is emitted from a light emitting surface of the light guide plate. The light emitting surface of the light guide plate is a surface, facing the display panel, of the light guide plate, such that the light may form an area source to be provided for the display panel after passing through the light guide plate. During specific implementation, the light strips have a linear shape, and since the light strips need to be assembled to the backplane, the backplane further needs to have a linear portion in the area of the backplane on which the light strips are assembled. Correspondingly, the first bottom plate has a shape of an N polygon. Since the backplane needs to match the circular display device, N is no longer a regular quadrangle, that is, the number of sides of the first bottom plate is greater than 4.

Figure 4:
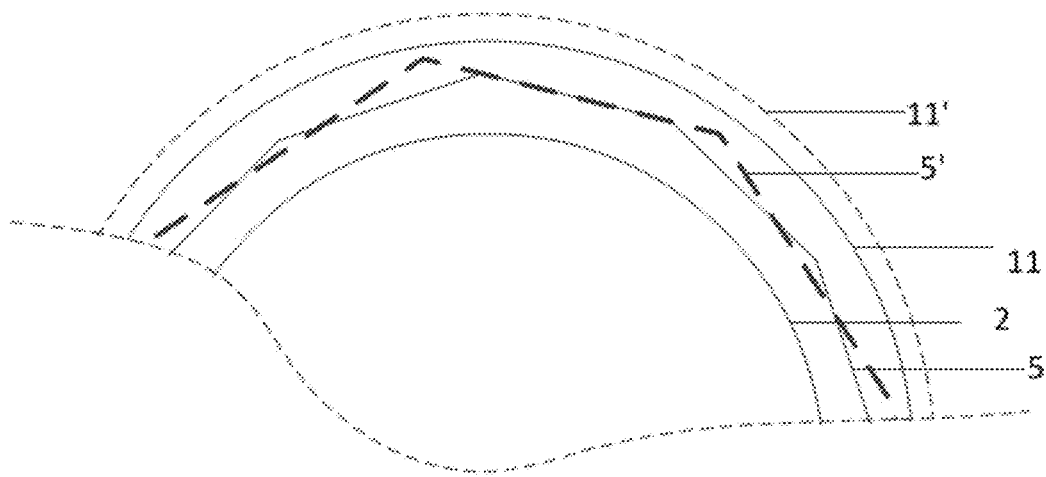
FIG. 4 is a schematic diagram of edge positions of a display device in the case of different N values according to an embodiment of the present disclosure.

During specific implementation, in order to satisfy a requirement of light mixing between the light strips and the display panel, a distance between the first side plate and the display area should not be less than a preset value. An assembly gap is required to be reserved between the backlight module and the assembly frame. Under the condition that a size of the display area and the distance between the first side plate and the display area are unchanged, the assembly gap is reserved between the backlight module and the assembly frame; and the less the number of sides of the backplane is, the greater the size of the bezel of the display device. The size of the bezel of the display device is the distance between the outer contour of the assembly frame and the display area. As shown in FIG. 4, an outer contour 11' of an assembly frame corresponding to the backplane 5' with N1 sides is located outside an outer contour 11 of an assembly frame corresponding to the backplane 5 with N2 sides, that is, a bezel size of a display device of the backplane with N1 sides is greater than a bezel size of a display device of the backplane with N2 sides, where N2>N1.

In some embodiments, as shown in FIGS. 2 and 3, the assembly frame 10 includes:
- a first assembly frame 14 including a front plate 16 and a second side plate 17 connected to the front plate 16 at an edge of the front plate 16; where the front plate 16 covers part of the peripheral area 3 at a side, facing away from the backlight module 4, of the display panel 1; and the second side plate 17 is opposite to a side surface of the display panel 1 and a side surface of the backlight module 4; and
- a second assembly frame 15 including a second bottom plate 18 between the backlight module 4 and the display panel 1, and a third side plate 19 connected to the second bottom plate 18 at an edge of the second bottom plate 18; where the third side plate 19 is located between the second side plate 17 and the first side plate 9 in a connection area of two adjacent first side plates 9.

During specific implementation, a shape of an orthographic projection of the first assembly frame in a direction perpendicular to the display panel is circular, that is, an outer contour of the first assembly frame is circular, and a shape of an area defined by the front plate is also circular. It should be noted that the outer contour 11 of the assembly frame in FIG. 1 is the outer contour of the first assembly frame.

During specific implementation, a shape of an orthographic projection of the second assembly frame in a direction perpendicular to the display panel may be also circular, and an inner contour and an outer contour of the second assembly frame may also be, for example, circular.

During specific implementation, both the first assembly frame and the second assembly frame need to expose the display area to prevent the assembly frames from affecting normal display of the display panel.

During specific implementation, a material of the first assembly frame may be, for example, a metal material or an insulation material, and the insulation material may be, for example, plastic. A material of the second assembly frame may be, for example, plastic.

In some embodiments, the number of the first side plates is the same as the number of sides of the first bottom plate. That is, in the case that the number of sides of the first bottom plate is N, the backplane includes N first side plates, and each side of the first bottom plate is connected to one first side plate.

In some embodiments, the first bottom plate has a shape of an N-sided regular polygon, that is, lengths of sides of the first bottom plate 8 are all equal, widths of the first side plates 9 are equal, and the widths of the first side plates are equal to the lengths of the sides of the first bottom plates.

In some embodiments, it is necessary to satisfy a condition as follows:

$$\cos^{-1}\left(\frac{R1+L1}{R2-L2}\right) = \frac{\pi}{N};$$

where N is an integer rounded up, R1 represents a radius of the display area, R2 represents a distance between a center of the display area and the outer contour of the first assembly frame, L1 represents a minimum distance between the first side plate and the display area, and L2 represents a distance between a joint of two adjacent first side plates and the outer contour of the first assembly frame.

It should be noted that under the condition that the radius of the display area is constant, if L1 is set to a minimum of the minimum distances between the first side plates and the display area, and L2 is set to a minimum of the distances between the joint of every two adjacent first side plates and the outer contour of the first assembly frame, the entire display device may have an extremely narrow frame contour.

Figure 5:
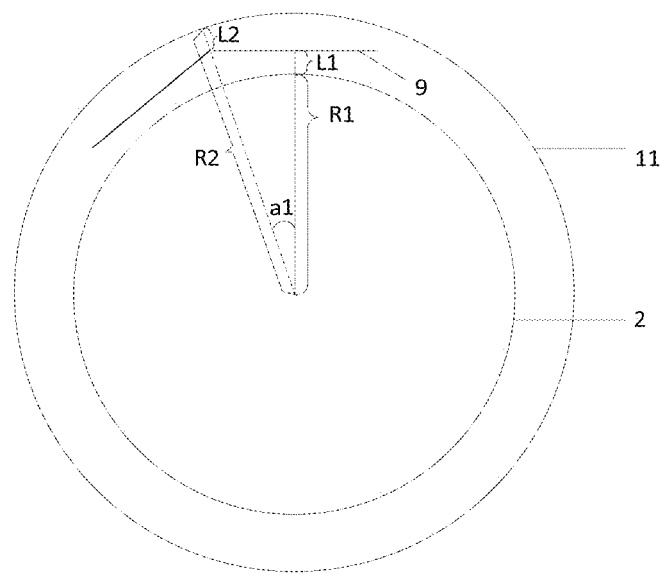
FIG. 5 is a schematic diagram of a display device satisfying limit sizes of R2, L1 and L2 according to an embodiment of the present disclosure.

A size of the display device satisfies the above limit sizes of L1 and L2, that is, as shown in FIG. 5, the distance between the center of the display area and the outer contour of the first assembly frame is R2, and a minimum distance between a side of the first side plate 9 and the display area is L1. When a shape of the first bottom plate is a regular polygon, the minimum distance corresponds to the location at half the width of the first side plate 9, and the distance between the joint of two adjacent first side plates and the outer contour of the first assembly frame is L2. In this case, as shown in FIG. 5, an angle corresponding to the side of the first side plate 9 is $$2a1 = 2\cos^{-1}\left(\frac{R1+L1}{R2-L2}\right).$$

Since the widths of the first side plates are equal, angles corresponding to the first side plates are equal accordingly and since the angles corresponding to the first side plates of the polygon are $2\pi$, $$\cos^{-1}\left(\frac{R1+L1}{R2-L2}\right) = \frac{\pi}{N}$$

is satisfied. In some embodiments, if an actual distance between the center of the display area and the outer contour of the first assembly frame is less than R2, the minimum distance between the side of the first side plate 9 and the display area is greater than L1, the distance between the joint of two adjacent first side plates and the outer contour of the first assembly frame is greater than L2, and therefore according to the above calculation thought, the number of sides of the first bottom plate is correspondingly increased. Therefore, the display device according to the embodiments of the present disclosure may satisfy expected R2 and satisfy a requirement of an assembly size of the display device in the case of $$\cos^{-1}\left(\frac{R1+L1}{R2-L2}\right) = \frac{\pi}{N}.$$

During specific implementation, when a value of R1 is preset, a size of R2 may be reduced to achieve narrow bezel display, and the number of sides of the polygonal backplane required by the narrow bezel display may be obtained according to simple deformation of the formula, that is $$N = \left\lceil \frac{\pi}{\cos^{-1}\left(\frac{R1+L1}{R2-L2}\right)} \right\rceil.$$

In some embodiments, L1 is greater than A1, where 2.1×P1≥A1≥1.2×P1, where P1 represent a distance between centers of two adjacent light sources in a light strip.

In some embodiments, the light source is a light-emitting diode (LED).

During specific implementation, in order to ensure a display effect of the display panel, the light strips and the display panel need to satisfy a light mixing condition, that is, it is required that 2.1≥((a distance between the light strip and the display area)/P1)≥1.2. 2.1×P1≥(the distance between the light strip and the display area)≥1.2×P1, and 2.1× P1≥A1≥1.2×P1, where A1=1.2×P1 may be understood as a minimum distance between the light strips and the display area satisfying the light mixing condition; and in this range, a mixed light display effect of special-shaped display is better. In consideration of a thickness of the light strips, an assembly space between the light strips and the backplane and other factors, L1 is larger than A1 in the embodiments of the present disclosure.

In some embodiments, in consideration of process limitation, 6≥P1≥4.8. In some embodiments, the display device further includes a first printed circuit board electrically connected to the light strips, and a thermal conduction adhesive for bonding the light strips to the first side plates; and the first printed circuit board is connected to the light strips to drive the light strips to emit light. The first printed circuit board is mounted, for example, in a gap between the first bottom plate and the light guide plate, For example, in FIG. 2, in the peripheral area 3, a recess area is formed between the first bottom plate 8 and the first side plate 9, and the recess area may accommodate the first printed circuit board.

That is, during specific implementation, an area with a minimum distance between the first side plates and the display area needs to accommodate at least the first printed circuit board, the light strips and the thermal conduction adhesive.

Accordingly, in some embodiments, L1=A1+h6+h7+h8; h6 represents a thickness of the light strip in a direction of the light strip pointing to the first side plate, h7 represents a thickness of the thermal conduction adhesive in the direction of the light strip pointing to the first side plate, and h8 represents a thickness of the first printed circuit board in the direction of the light strip pointing to the first side plate.

During specific implementation, the distance between the centers of two adjacent light sources is P2+2P3, where P2 represents a gap between two adjacent light sources, P3 represents half a width of the light source in an extension direction of the light strip, and the widths of the light sources are the same in the extension direction of the light strip. In consideration of the process limitation, in order to avoid increase in difficulty of light strip manufacturing, P2 and P3 satisfy the following conditions: P2≥0.8 mm, P3≥2 mm. In some embodiments, P1≥4.8 mm. P1 satisfies 6 mm≥P1≥4.8 mm, for example.

In some embodiments, in order to achieve the narrow bezel effect, P1 is 4.8 mm, A1=1.2×P1=5.76 mm, h6 is 0.65 mm, h7 is 1 mm, and h8 is 0.2 mm; and therefore L1=7.61 mm.

In some embodiments, as shown in FIGS. 1 and 3, it is necessary to accommodate at least the first side plate 9, the third side plate 19 and the second side plate 17 between the joint of adjacent first side plates 9 and the outer contour 11 of the assembly frame. Assembly gaps need to be provided between the first side plate 9 and the third side plate 19 and between the third side plate 19 and the second side plate 17. Accordingly, in some embodiments, L2=h1+h2+h3+h4+h5, where h1 represents a thickness of the second side plate 17, h2 represents the gap between the third side plate 19 and the second side plate 17, h3 represents a thickness of the third side plate 19, h4 represents the gap between the first side plate 9 and the third side plate 19, and h5 represents a thickness of the first side plate 19.

In some embodiments, in order to achieve the narrow bezel effect, h1 is 2 mm, h2 is 0.15 mm, h3 is 1 mm, h4 is 0.15 mm, and h5 is 1.2 mm, and therefore L2=4.5 mm. In some cases of process limits, (L2≥4 mm) may be satisfied.

According to demands for practical applications of a large-size special-shaped display product, in the case that the number of corresponding bezels is large, the bezels are narrow; but the number of assembled parts is large and a process is complicated; and in the case that the number of bezels is small, the bezels are wide, but the number of assembled parts is small and a process is simple. In some embodiments, (R2−R1)/R1 is greater than or equal to 0.045 and less than or equal to 0.114.

In some embodiments, the display device further includes a plurality of converters, and each of the converters is electrically connected to even-numbered light strips. Therefore, evenness of currents and voltages distributed by the converters to the light strips may be guaranteed and uneven brightness of different light strips is avoided.

During specific implementation, the converters are electrically connected to the light strips through the first printed circuit board.

In some embodiments, the display device includes two converters, the display device includes a plurality of light strips to achieve even light mixing, each side plate is provided with a corresponding light strip, the light strips correspond to the first side plates in a one-to-one manner, and the number of the first side plates is a multiple of 4.

It should be noted that assembly gaps need to be reserved among the display panel, the backlight module, the assembly frame, etc. for assembly; and the backlight module, the assembly frame and other components have a certain thickness. In consideration of assembly difficulty and manufacturing cost of components, although the larger the number of sides of the first bottom plate is, the smaller the size of the bezel of the display device is, an upper limit needs to be considered when the number of sides of the first bottom plate is increased.

Figure 6:
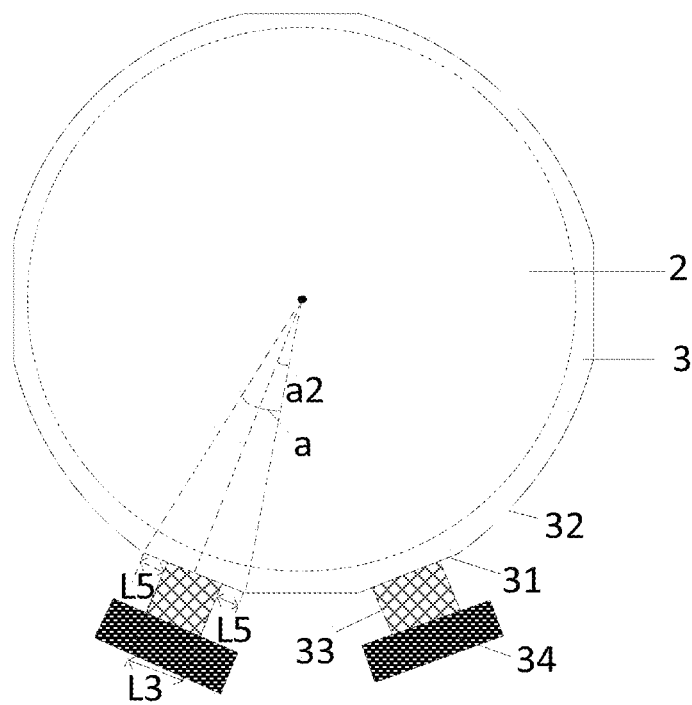
FIG. 6 is a schematic diagram of bonding chip-on-film circuit boards to a display panel according to an embodiment of the present disclosure.
Figure 7:
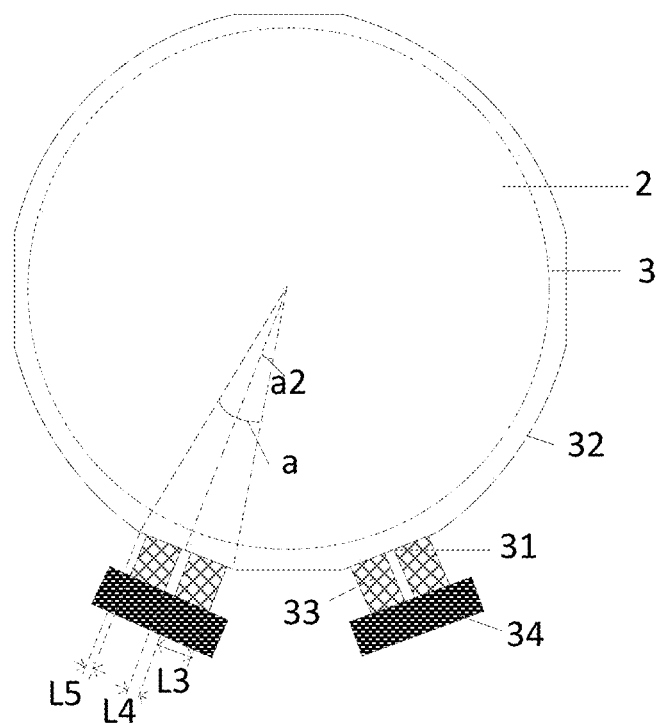
FIG. 7 is another schematic diagram of bonding chip-on-film circuit boards to a display panel according to an embodiment of the present disclosure.

In some embodiments, as shown in FIGS. 6 and 7, the display panel 1 includes a plurality of straight sides 31 and a plurality of cambered sides 32.

In some embodiments, as shown in FIGS. 6 and 7, the display device further includes: a plurality of chip-on-film circuit boards 33 bonded to the display panel 1 at a portion, corresponding to at least part of the straight sides 31, of the peripheral area.

It should be noted that, in FIGS. 6 and 7, description is made by taking a display panel 1 including 6 straight sides 31 and 4 cambered sides 32 as an example. A plurality of chip-on-film circuit boards 33 correspond to two straight sides 31, two ends of the cambered side 32 are connected to the straight sides 31 separately, and the two straight sides 31 corresponding to the chip-on-film circuit boards 33 are connected through a straight side 31. At least one chip-on-film circuit board 33 may be bonded to one straight side 31; the plurality of chip-on-film circuit boards 33 may be bonded to one straight side 31, for example, 2, 3, 4 or more chip-on-film circuit boards may be bonded to one straight side; and the number of chip-on-film circuit boards that may be bonded to one straight side 31 is related to resolution of the entire display device and other factors.

It should be noted that in the display device according to the embodiments of the present disclosure, the display panel is provided with the cambered side. In a preparation process of the display panel, since the base substrates of the array substrate and the opposite substrate are usually glass substrates, when a cutting process is performed, the glass substrates in an area corresponding to the cambered side may be cut without changing a cutting angle; and compared with the cutting design of full straight sides, operation time of an entire cutting process may be saved, and preparation efficiency of the display device may be improved.

It should be noted that FIGS. 6 and 7 are schematic diagrams of a chip-on-film circuit board that is bonded to a display panel but is not assembled to a backlight module and an assembly frame.

During specific implementation, the chip-on-film circuit boards need to be bent towards a back surface of a first bottom plate. Further, at least part of the chip-on-film circuit boards is bent along a first side plate. Preferably, all the chip-on-film circuit boards are bent along the first side plates. Therefore, a side length of a straight side to which the chip-on-film circuit board is bonded is less than or equal to a width of the first side plate.

In some embodiments, it is necessary to satisfy $$\tan^{-1}\left(\frac{nL3 + (n-1)L4}{2(R1 + L1)}\right) \leq \frac{\pi}{N},$$

where if the number of sides of the first bottom plate is solved and optimized through simple deformation of the formula, N represents an integer rounded down; L3 represents a width of the chip-on-film circuit board in an extension direction of the straight side, n represents the number of chip-on-film circuit boards bonded to one straight side, L4 represents a gap between adjacent chip-on-film circuit boards bonded to one straight side, and L5 is set to a distance between a chip-on-film circuit board closest to an end of the bonded straight side and the end of the straight side.

In some embodiments, as shown in FIG. 6, only one chip-on-film circuit board 33 is bonded to the portion, corresponding to at least part of the straight sides 31, of the peripheral area 3.

In the case that one straight side corresponds to only one chip-on-film circuit board, a minimum of the straight side is L3+2L5. In this case, a minimum width of the first side plate is L3, a1=a2, where a represents a central angle corresponding to the straight side to which the chip-on-film circuit board is bonded, and a2 represents ½ of the included angle a. Since a1=π/N, and in the limit case, the side length of the straight side to which the chip-on-film circuit board is bonded is less than or equal to the width of the first side plate, thus it is necessary to satisfy $$\tan^{-1}\left(\frac{L3}{2(R1 + L1)}\right) \leq \frac{\pi}{N}.$$

In some embodiments, as shown in FIG. 7, two chip-on-film circuit boards 33 are bonded to the portion, corresponding to at least part of the straight sides 31, of the peripheral area 3.

In the case that one straight side corresponds to two chip-on-film circuit boards, a minimum of the straight side is 2L3+L4, and in the limit case, a width of the first side plate is 2L3+L4, a1=a2. Since a1=π/N, and in this case, the side length of the straight line to which the circuit board with flip-chip films are bonded is less than or equal to the width of the first side plate, thus N needs to satisfy $$\tan^{-1}\left(\frac{2L3 + L4}{2(R1 + L1)}\right)N \leq \frac{\pi}{N}.$$

In some embodiments, P1 is 6 mm, A1=2.1×P1=12.6 mm, h6 is 0.65 mm, h7 is 1 mm, and h8 is 0.2 mm; and therefore L1=14.5 mm.

In some embodiments, the width of a single chip-on-film circuit board is 42 mm. Further, in consideration of a bonding process limit, L4≥15 mm.

A distance between the chip-on-film circuit board and an edge of a corresponding straight side thereof is 10 mm.

In some embodiments, as shown in FIGS. 6 and 7, the display device further includes a plurality of second printed circuit boards 34 bonded to the chip-on-film circuit boards 33.

Figure 8:
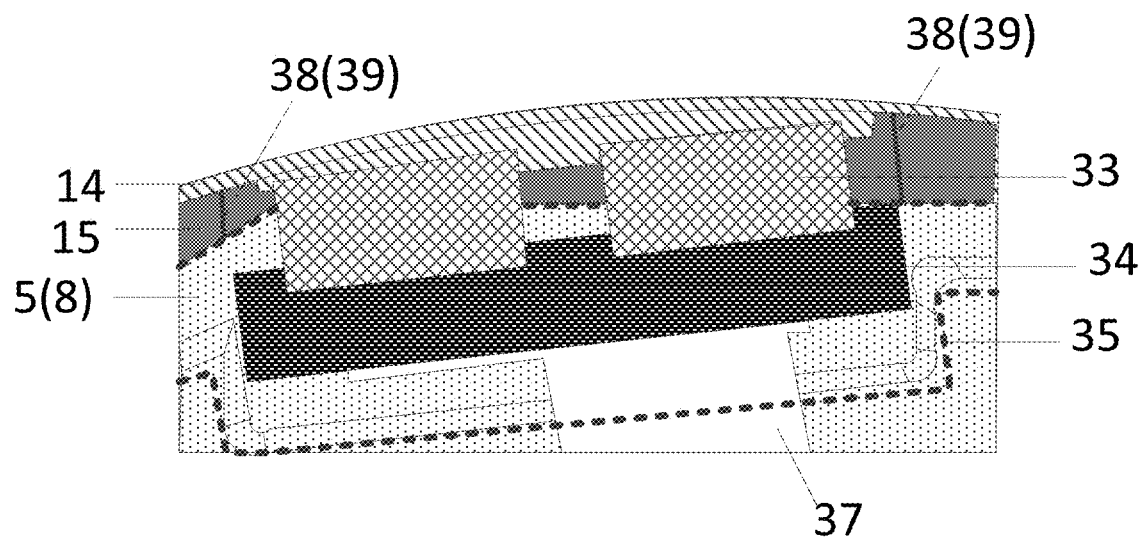
FIG. 8 is a schematic structural diagram of another display device according to an embodiment of the present disclosure.

During specific implementation, as shown in FIG. 8, the chip-on-film circuit board 33 penetrates a gap between the first assembly frame 14 and the second assembly frame 15 to bend towards a side, facing away from the display panel, of the backplane 5.

In some embodiments, as shown in FIG. 8, at a side, facing away from the display panel, of the first bottom plate, the backplane 5 is provided with a plurality of first recesses 35 recessed towards a side of the display panel, and the first recess 35 accommodates the second printed circuit board 34.

Figure 9:
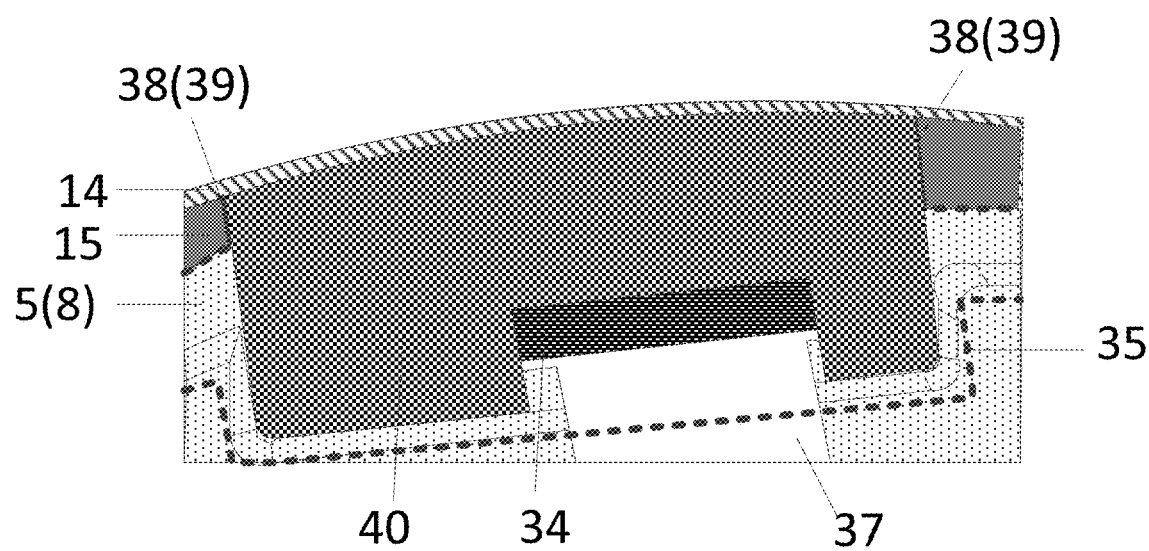
FIG. 9 is a schematic structural diagram of another display device according to an embodiment of the present disclosure.

In some embodiments, as shown in FIG. 9, the display device further includes cover members 40 that cover the second printed circuit boards 34 and the chip-on-film circuit boards 33 at the side, facing away from the display panel, of the backplane 5.

In some embodiments, as shown in FIGS. 8 and 9, the second assembly frame 15 includes alignment marks 38 corresponding to the cover members 40 in a one-to-one manner; and the alignment mark 38 includes two alignment mark lines 39 parallel to a pair of sides of the cover member 40 respectively, and the pair of sides of the cover member 40 overlap the alignment mark lines 39.

That is, in the display device according to the embodiments of the present disclosure the second printed circuit boards and the chip-on-film circuit boards are protected by arranging the cover members at the side, facing away from the display panel, of the backplane, and the alignment marks are arranged on the second assembly frame, such that when the cover members are assembled to the backplane and the assembly frame, the alignment marks may be used for assembly alignment to avoid assembly deviation.

It should be noted that FIGS. 8 and 9 merely show part of areas of the display device.

In some embodiments, the cover member is stuck to the second assembly frame and the backplane through an adhesive material; and a thickness of the adhesive material between the second assembly frame and the cover member is greater than a thickness of a first adhesive material between the backplane and the cover member.

It should be noted that there is mismatch discrepancy between the second assembly frame and the chip-on-film circuit board. When the cover member is stuck to the second assembly frame and the backplane through an adhesive material having an even thickness, the cover member is likely to become uneven when stuck to the second assembly frame, thereby causing the cover member to tilt, etc.

In the display device according to the embodiments of the present disclosure, a thickness of the adhesive material between the second assembly frame and the cover member is greater than a thickness of the first adhesive material between the backplane and the cover member, such that the assembly mismatch discrepancy is eliminated through the adhesive material, and the problem of uneven sticking of the cover member is avoided.

In some embodiments, the adhesive material includes: a first adhesive material stuck to the cover member and a second adhesive material at a side, facing away from the cover member, of the first adhesive material; and the second adhesive material is at least stuck to the second assembly frame.

That is, in the display device according to the embodiments of the present disclosure, in an area where the second assembly frame is stuck to the adhesive material, a composite adhesive material composed of the first adhesive material and the second adhesive material is used to assemble the cover member to the second assembly frame, such that the assembly mismatch discrepancy is eliminated through the adhesive material, and the problem of uneven sticking of the cover member is avoided.

Figure 10:
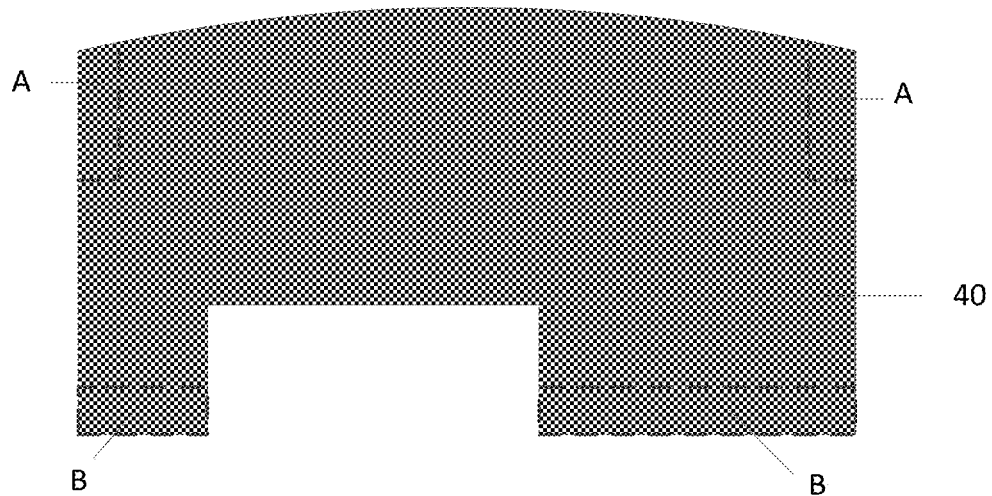
FIG. 10 is a schematic diagram of an adhesive application area of a cover member according to an embodiment of the present disclosure.

During specific implementation, as shown in FIG. 10, areas A and B are areas where the cover member is provided with the adhesive material. During specific implementation, the area A corresponds to a sticking area of the second assembly frame, and the area B corresponds to a sticking area of the backplane. In the area B, the cover member may be stuck to the backplane merely by using the first adhesive material; and in the area A, the cover member may be stuck to the second assembly frame by using the first adhesive material and the second adhesive material.

Figure 11:
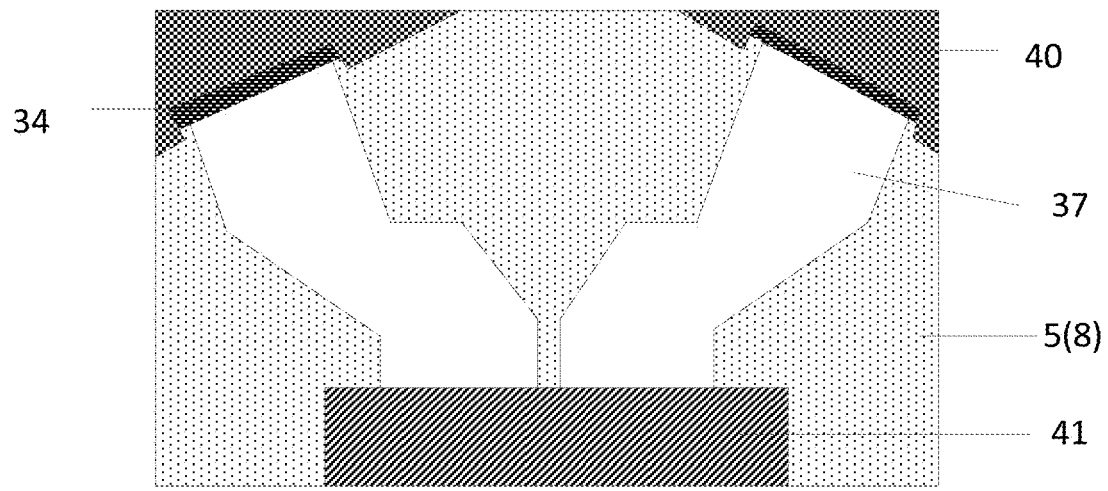
FIG. 11 is a schematic structural diagram of another display device according to an embodiment of the present disclosure.

In some embodiments, as shown in FIG. 11, the display device further includes: a controller 41 assembled to the backplane at the side, facing away from the display panel, of the backplane 5, and a plurality of flexible printed circuit boards 37; where an end of the flexible printed circuit board 37 is connected to the controller 41, and the other end of the flexible printed circuit board 37 is connected to the second printed circuit board 34.

Figure 12A:
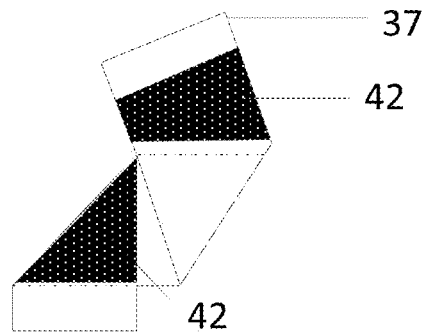
FIG. 12A is a schematic diagram of a flexible printed circuit board in a bent state according to an embodiment of the present disclosure.

As shown in FIG. 12A, the flexible printed circuit board 37 is stuck to the backplane through a third adhesive material 42.

Figure 12B:
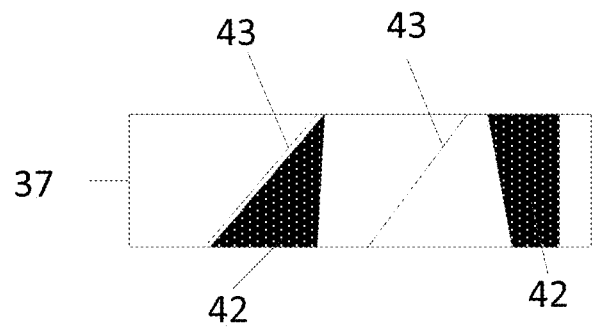
FIG. 12B is a schematic diagram of a flexible printed circuit board in an unbent state according to an embodiment of the present disclosure.

It should be noted that, as shown in FIG. 12B, the flexible printed circuit board is rectangular, the rectangular flexible printed circuit board is bent along bending lines 43, and a bent state is as shown in FIG. 12A, so that the requirement of a special-shaped interface is satisfied through two times of bending. In addition, the third adhesive material 42 is provided in the areas shown in FIGS. 12A and 12B, such that the flexible printed circuit board 37 is stuck to the backplane with the third adhesive material 42. During specific implementation, the third adhesive material is, for example, double-sided adhesive tape. During specific implementation, the double-sided adhesive tape may be stuck to the areas corresponding to the third adhesive materials 42 in FIGS. 12A and 12B of the flexible printed circuit board. For example, after the flexible printed circuit board is bent along the bending lines, the double-sided adhesive tape may be stuck to areas, at a side facing the backplane, of flexible printed circuit board and close to two ends of flexible printed circuit board; and then the flexible printed circuit board may be stuck to the backplane, such that the areas at the two ends of flexible printed circuit board are stuck to the backplane through the double-sided adhesive tape. Certainly, the double-sided adhesive tape may be stuck to the backplane, and is stuck to the backplane after the flexible printed circuit board is bent, such that the areas close to the two ends of the flexible printed circuit board are stuck to the backplane through the double-sided adhesive tape. For example, the areas with the double-sided adhesive tape of the backplane may correspond to the areas corresponding to the third adhesive materials 42 in FIGS. 12A and 12B. The above two ways of sticking the double-sided adhesive tape may make the flexible printed circuit board to be stuck to the backplane through the double-sided adhesive tape.

During specific implementation, a drive signal may be applied to the display panel through the controller, the flexible printed circuit board, the second printed circuit board and the chip-on-film circuit board.

It should be noted that FIG. 11 merely shows part of areas of the display device.

In some embodiments, as shown in FIGS. 2, 13, 14 and 15, the backplane further includes: a plurality of first connectors 21 that are integrally connected to the first side plates 9 outside a joint of two adjacent first side plates 9 and are configured for fixation to the assembly frame 10.

In the display device according to the embodiments of the present disclosure, the first connector is integrally connected to the first side plate 9, and is fixed to the assembly frame through the first connector integrally connected to the side plate, such that it is unnecessary to additionally arrange a component for fixing the backplane to the assembly frame, cost may be saved, and a preparation process of the display device may be shortened. In addition, the first connector is integrally connected to the first side plate, such that a strength of the backplane May be improved.

In some embodiments, distances between two ends of the first connector and edges of the first side plate are equal. That is, a middle of the first side plate is connected to the first connector, such that the first connector is arranged in an area with a largest distance between the first side plate and the outer contour of the assembly frame, and difficulty of assembling the backplane to the assembly frame may be reduced while a narrow bezel is achieved.

In some embodiments, as shown in FIGS. 2, 13, 14 and 15, the first connector 21 includes a first connection portion 24 parallel to a plane where the first bottom plate is located.

Figure 13:
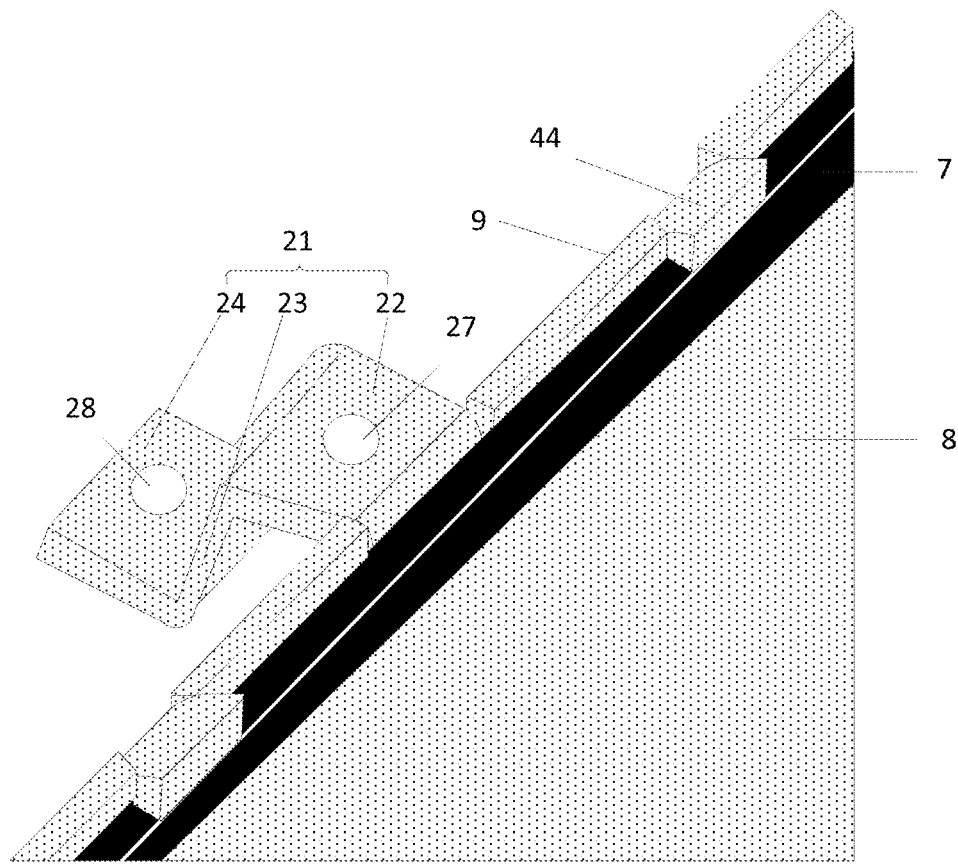
FIG. 13 is a schematic structural diagram of another display device according to an embodiment of the present disclosure.
Figure 14:
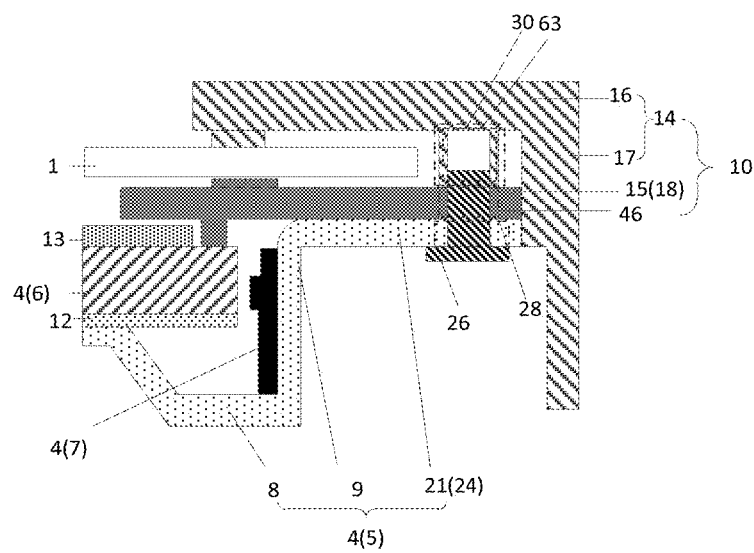
FIG. 14 is a schematic structural diagram of another display device according to an embodiment of the present disclosure.

In some embodiments, as shown in FIGS. 2, 13 and 14, the first connection portion 24 includes a first opening 28; the first assembly frame 14 includes first rivet studs 30 corresponding to the first openings 28 in a one-to-one manner; and the first rivet stud 30 is fixed to the first connection portion 24 through a first screw 26 in an area of the first opening 28.

In some embodiments, as shown in FIGS. 2 and 14, the second assembly frame 15 further includes a second opening 46 at least avoiding an opening of the first rivet stud 30.

In some embodiments, as shown in FIG. 2, the second opening 46 avoids the first rivet stud 30.

It should be noted that for a circular display device, contours of a first assembly frame and a second assembly frame are both circular, and it is not easy to assemble the first assembly frame and the second assembly frame together. In the display device according to the embodiments of the present disclosure, the second assembly frame includes the second opening at least avoiding the opening of the first rivet stud, that is, when the first assembly frame and the second assembly frame are assembled together, the first rivet stud may penetrate the second opening, so as to facilitate assembly and subsequent fixation of the backplane to the assembly frame through the first rivet stud.

Or, in some embodiments, as shown in FIG. 14, the first rivet stud 30 has an opening 63, and the second opening 46 merely avoids the opening 63 of the first rivet stud 30.

During specific implementation, the second opening may also be a threaded opening. such that the first connection portions, the second assembly frame and the first assembly frame may be fixed through the first screws.

During specific implementation, according to an arrangement position of the first rivet stud, the second opening may be a circular, such as a closed opening as shown in FIG. 14. Or, as shown in FIG. 2, the second opening 46 may be formed by removing part of areas in an edge of the second assembly frame 15.

In some embodiments, as shown in FIGS. 2 and 13, the first connector 21 further includes a second connection portion 23 and a third connection portion 22; the third connection portion 22 is connected to the first side plate 9; two ends of the second connection portion 23 are connected to the third connection portion 22 and the first connection portion 24 respectively; the first connection portion 24 is parallel to the third connection portion 22; and the second connection portion 23 is parallel to the first side plate 9. That is, the first connector 21 includes the first connection portion 24, the second connection portion 23 and the third connection portion 22 that are connected to each other in sequence.

As shown in FIG. 2, the first connector 21, the first side plate 9 and the first bottom plate 8 form a triple-bent structure.

In some embodiments, as shown in FIGS. 2 and 13, the third connection portion 22 includes a third opening 27; and the second assembly frame 15 includes threaded openings 29 corresponding to the third openings 27 in a one-to-one manner, and the third connection portion 22 is fixed to the second assembly frame 15 through a second screw 25 in an area of the third opening 27 and the threaded opening 29.

During specific implementation, the first opening and the third opening are threaded openings. The threaded opening means that the component is provided with threads at a side surface of an opening area, so as to be screwed to the screw.

Figure 15:
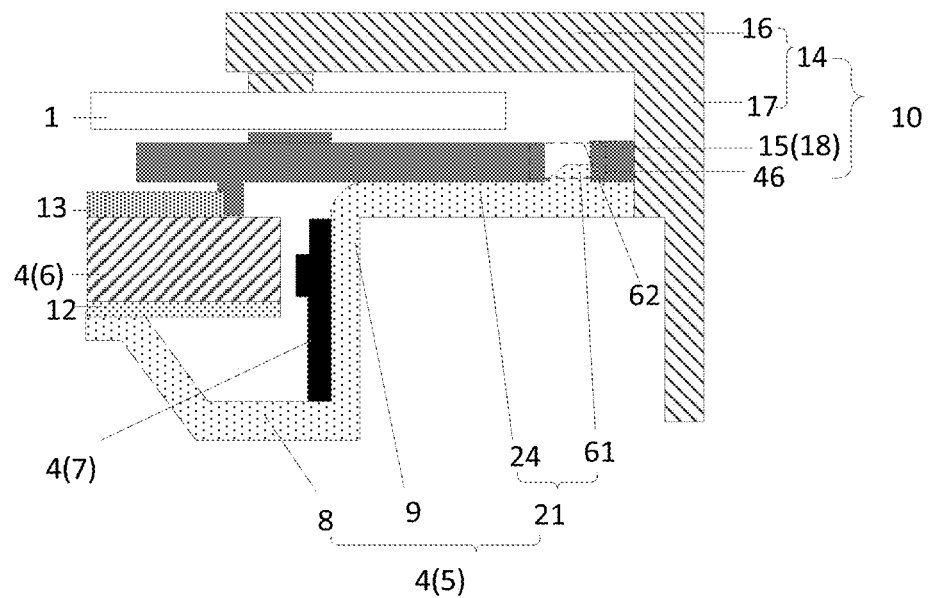
FIG. 15 is a schematic structural diagram of another display device according to an embodiment of the present disclosure.

Or, in some embodiments, as shown in FIGS. 14 and 15, the first connection portion 24 is connected to the first side plate 9.

In some embodiments, as shown in FIG. 14, the first connector 21 merely includes the first connection portion 24. That is, the first connector 21 including merely the first connection portion 24 is fixed to the assembly frame through the first screw 26.

It should be noted that the first connector may be formed through a bending process. In the display device according to the embodiments of the present disclosure, when the first connector merely includes the first connection portion, the first connector may be formed merely through bending once, such that the number of die projects in the bending process may be reduced, die cost may be reduced, and production efficiency of the backplane may be improved. Since merely bending once is needed, a product yield may be improved, and a size deviation caused by secondary bending may be avoided. In addition, in an area corresponding to the first connector, the backplane may be fixed to the assembly frame through only one screw, such that the number of components may be reduced, the cost may be saved, and a mounting error may be reduced.

In some embodiments, as shown in FIG. 15, the first connector 21 further includes: a first buckle 61 at a side, close to the second assembly frame 15, of the first connection portion 24; and the second assembly frame 15 includes first buckling openings 62 corresponding to the first buckles 61 in a one-to-one manner, and the first buckle 61 is buckled to the second assembly frame 15 at the first buckling opening 62.

In the display device according to the embodiments of the present disclosure, the first connector includes the first connection portion and the first buckle. The first connector is connected to the first side plate, such that the first connection portion may be formed merely through bending once, such that the number of die projects in the bending process may be reduced, the die cost may be reduced, and production efficiency of the backplane may be improved. Since merely bending once is needed, a product yield may be improved, and a size deviation caused by secondary bending may be avoided. In addition, the first buckle is buckled to the second assembly frame, such that the operation is simple, screws may be saved, and the cost may be further saved.

In some embodiments, as shown in FIG. 13, the first side plate 9 includes at least one first bent portion 44 bent towards a side of the light strip 7, and the light strip 7 is located between the first bent portion 44 and the first bottom plate 8.

Therefore, through the first bent portion, a height of the light strip may be limited and the light strip may be fixed; and a display effect may be prevented from being influenced by deviation of a position of the first light strip.

It should be noted that in FIG. 13, description is made by taking the first connector including the first connection portion, the second connection portion and the third connection portion as an example. Certainly, during specific implementation, in the case that the first connector merely includes the first connection portion or includes the first connection portion and the first buckle, the first bent portion may further be arranged on the first side plate, which will not be described in detail herein.

In some embodiments, as shown in FIG. 13, the first side plate 9 includes two first bent portions 44. The two first bent portions 44 are located at two sides of a joint between the first connection portion 21 and the first side plate 9 respectively, but the number of the first bent portions arranged in each first side plate is not limited herein.

It should be noted that FIG. 13 merely shows part of areas of the backplane and the light strips.

In some embodiments, the second side plate includes a plurality of second buckles, the third side plate includes second buckling openings corresponding to the second buckles in a one-to-one manner, and the second buckle is buckled to the third side plate at the second buckling opening.

In some embodiments, the chip-on-film circuit boards are bent along the first side plates; and the first connector is merely connected to a first side plate that does not correspond to the chip-on-film circuit board.

It should be noted that since the chip-on-film circuit boards need spaces for bending, it is more difficult to arrange the first connector to be integrally connected to the first side plate corresponding to the chip-on-film circuit board; and in the display device according to some embodiments of the present disclosure, no first connector is arranged to be integrally connected to the first side plate corresponding to the chip-on-film circuit board.

In some embodiments, the display device includes K second printed circuit boards, where K is an integer greater than 1 and less than N, each of the second printed circuit boards is connected to at least one chip-on-film circuit board, and each of the second printed circuit boards corresponds to one of the first side plates; and the backplane may include N-K first connectors.

Figure 16:
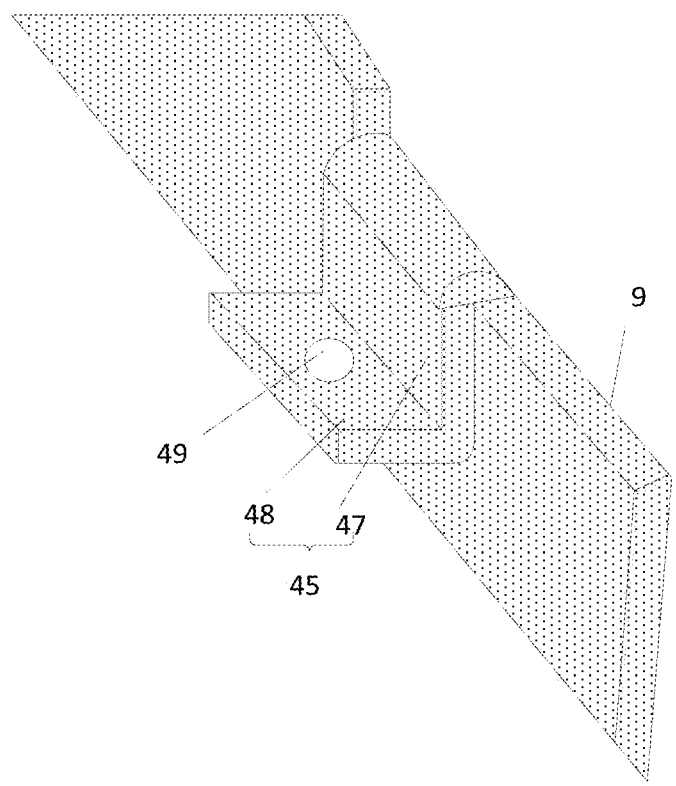
FIG. 16 is a schematic structural diagram of another display device according to an embodiment of the present disclosure.
Figure 17:
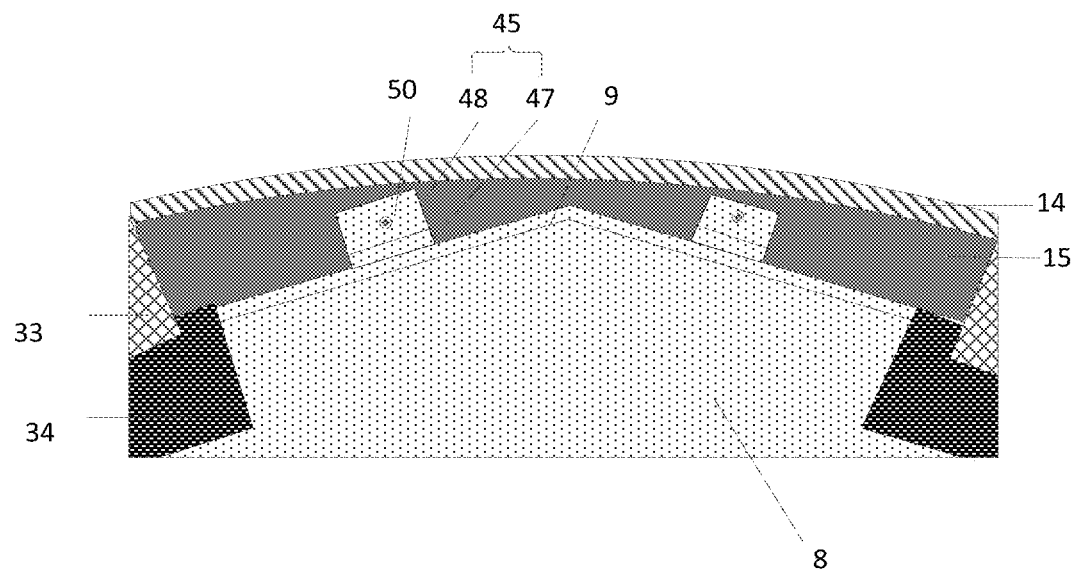
FIG. 17 is a schematic structural diagram of another display device according to an embodiment of the present disclosure.

In some embodiments, as shown in FIGS. 16 and 17, the backplane further includes: a plurality of second connectors 45 connected to the first side plates 9 corresponding to the chip-on-film circuit boards 33 in an area other than bent areas of the chip-on-film circuit boards 33; and the second connectors 45 are configured for fixation to the first assembly frame 14.

That is, at the areas corresponding to the chip-on-film circuit boards, the backplane is fixed to the assembly frame through the second connectors.

In some embodiments, as shown in FIG. 16, the second connector 45 includes: a fourth connection portion 47 in bent connection to the first side plate 9, and a fifth connection portion 48 connected to the fourth connection portion 47;

the fifth connection portion 48 has a fourth opening 49; and the first assembly frame has second rivet studs that correspond to the fourth openings 49 in a one-to-one manner and penetrate the fourth openings 49, and in the fourth opening, the second rivet stud is fixed to the second connection portion 45 through a third screw 50.

During specific implementation, the fourth openings may be threaded openings.

In some embodiments, the second assembly frame has a fifth opening avoiding the second rivet stud. In the display device according to the embodiments of the present disclosure, the second assembly frame includes the fifth opening at least avoiding the second rivet stud, that is, when the first assembly frame and the second assembly frame are assembled together, the second rivet stud may penetrate the fourth opening, so as to facilitate assembly and subsequent fixation of the second connection portion to the assembly frame through the second rivet stud.

Figure 18:
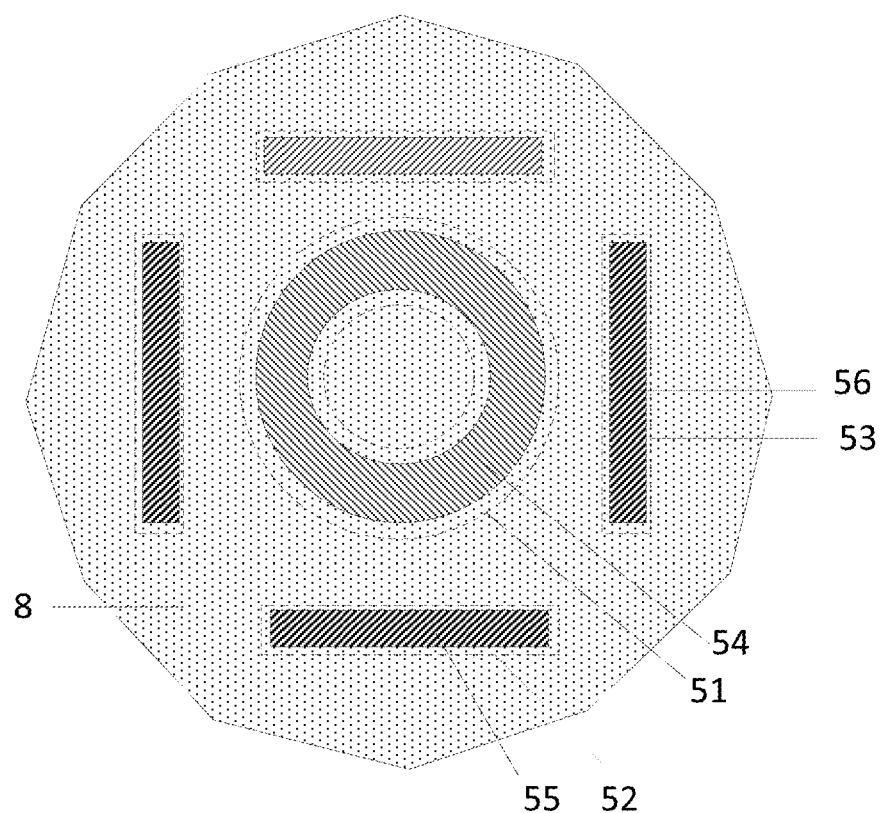
FIG. 18 is a schematic structural diagram of another display device according to an embodiment of the present disclosure.

In some embodiments, as shown in FIG. 18, at a side facing away from the display panel, the first bottom plate further includes: an annular protrusion 51, a pair of first strip-shaped protrusions 52 arranged oppositely, and a pair of second strip-shaped protrusions 53 arranged oppositely; where a center of the annular protrusion 51 coincides with the center of the display area, the first strip-shaped protrusions 52 intersect with the second strip-shaped protrusions 53, the annular protrusion 51 is located between the pair of first strip-shaped protrusions 52 arranged oppositely, and the annular protrusion 51 is located between the pair of second strip-shaped protrusions 53 arranged oppositely; and the display device further includes: an annular reinforcing rib 54 at a side, facing away from the display panel, of the annular protrusion 51; a first strip-shaped reinforcing rib 55 at a side, facing away from the display panel, of the first strip-shaped protrusion 52; and a second strip-shaped reinforcing rib 56 at a side, facing away from the display panel, of the second strip-shaped protrusion 53.

In the display panel according to the embodiments of the present disclosure, a support strength of the backplane is improved by arranging the first strip-shaped reinforcing rib and the second strip-shaped reinforcing rib, the support strength of the backplane is further improved by arranging the annular reinforcing rib, and flatness of the backplane is guaranteed at the same time.

Figure 19:
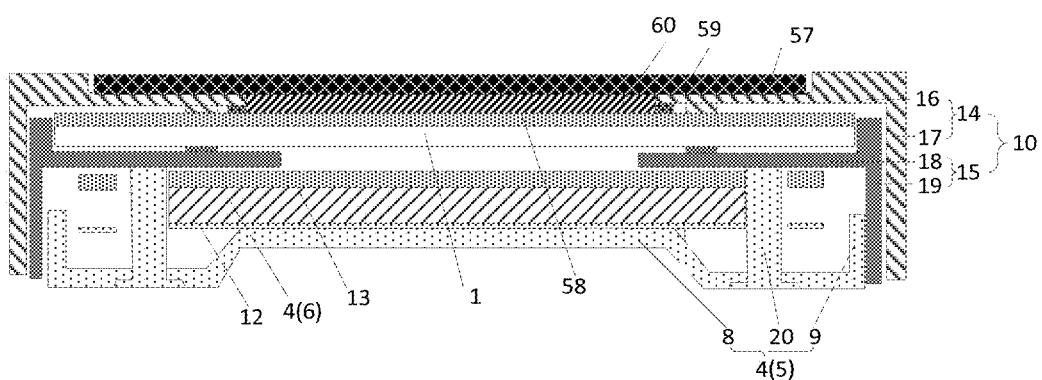
FIG. 19 is a schematic structural diagram of another display device according to an embodiment of the present disclosure.

In some embodiments, as shown in FIG. 19, the display device further includes: a mirror cover plate 57 at a side, facing away from the display panel 1, of the front plate 16.

In the display device according to the embodiments of the present disclosure, the cover plate is the mirror cover plate, such that the mirror cover plate may be used as a mirror when the light strips of the display product goes out, thereby enriching functions of the display device and increasing practicability of the display device.

During specific implementation, a material of the mirror cover plate is pure round non-tempered glass; and a thickness of the mirror cover member plate is, for example, 1.8 mm. For example, the mirror cover plate has transmittance of 30% and a reflectance of 70%. During specific implementation, as shown in FIG. 16, the recess may be provided on the front plate to limit a position of the mirror cover plate, and a depth of the groove on the front plate is, for example, 2 mm.

In some embodiments, as shown in FIG. 19, the display device further includes:

a first optical film 58 between the front plate 16 and the display panel 1;

a frame sealant 59 connecting the front plate 16 to the first optical film 58 at an edge of a side, close to the display area, of the front plate 16; and an adhesive glue 60 between the first optical film 58 and the mirror cover plate 57 in an area encircled by the front plate 16.

In the display device according to the embodiments of the disclosure, an edge of the front plate is encapsulated by the frame sealant, such that the adhesive glue may be prevented from flowing to other gaps.

In some embodiments, as shown in FIGS. 2 and 3, the backlight module 4 further includes a reflector sheet 12 between the first bottom plate 8 and the light guide plate 6, and the display device further includes a second optical film 13 between the light guide plate 6 and a plastic frame 18. As shown in FIG. 3, the backplane 5 further includes a second rivet stud 20 connected to the first bottom plate 8, and the reflector sheet 12 and the second optical film 13 have openings avoiding the second rivet stud 20, such that positions of the reflector sheet 12 and the second optical film 13 are limited by the second rivet stud 20.

During specific implementation, the first optical film and the second optical film each include a polarizer, for example. Therefore, light emitted from a side, facing the second optical film, of the light guide plate changes into polarized light after passing through the second optical film. When an electric field generated between a common pixel electrode and the common electrode controls deflection of liquid crystal molecules in the liquid crystal layer, a polarization state of polarized light incident on the liquid crystal display panel from the second optical film may be affected; and under the action of the polarizer in the first optical film to the light, intensity of emitted light may be controlled to be changed, so as to display brightness and darkness to present an image.

The display device according to the embodiments of the present disclosure is any product or component with a display function, such as a watch, a display, a digital photo frame and a navigator. Other essential components of the display device shall be understood as necessary by those of ordinary skill in the art, are not repeated herein, and should not be regarded as limitation to the present disclosure.

To sum up, based on the display device according to the embodiments of the present disclosure, the distance between the display area and the outer contour of the assembly frame is reduced, the size of the bezel is reduced, and the display effect is improved.

Although preferred embodiments of the present disclosure have been described, a person of ordinary skill in the art can make additional changes and modifications to these embodiments once they learn the basic inventive concept. Therefore, the appended claims are intended to be construed as including the preferred embodiments and all modifications and changes falling within the scope of the present disclosure.

Apparently, a person of ordinary skill in the art can make various modifications and variations to the embodiments of the present disclosure without departing from the spirit and scope of the embodiments of the present disclosure. Thus, if these modifications and variations of the embodiments of the present disclosure fall within the scope of the claims of the present disclosure and their equivalents, it is intended that the present disclosure encompass these modifications and variations.

What is claimed is:

1. A display device, comprising:
    a display panel, comprising a display area and a peripheral area surrounding the display area;
    a backlight module at a light incident side of the display panel; wherein the backlight module comprises a backplane, a light guide plate and a plurality of light strips; the backplane comprises a polygonal first bottom plate, and a plurality of first side plates connected to the first bottom plate at an edge of the first bottom plate; the light guide plate is located between the first bottom plate and the display panel; and the plurality of light strips are located between the plurality of first side plates and the light guide plate; and
    an assembly frame, assembled to the display panel and the backlight module at an edge of the display panel and an edge of the backlight module; wherein a shape of an outer contour of the assembly frame is a circle;
    wherein the first side plate comprises at least one first bent portion bent towards a side of the light strip; and
    the light strip is located between the first bent portion and the first bottom plate.

2. The display device according to claim 1, wherein the assembly frame comprises:
    a first assembly frame; wherein the first assembly frame comprises a front plate and a second side plate connected to the front plate at an edge of the front plate; the front plate covers part of the peripheral area at a side, facing away from the backlight module, of the display panel; and the second side plate is opposite to a side surface of the display panel and a side surface of the backlight module; and
    a second assembly frame; wherein the second assembly frame comprises a second bottom plate between the backlight module and the display panel, and a third side plate connected to the second bottom plate at an edge of the second bottom plate; and the third side plate is located between the second side plate and the first side plate in a connection area of two adjacent first side plates;
    wherein a shape of the display area is a circle; and
    $(R2-R1)/R1$ is greater than or equal to 0.045 and less than or equal to 0.114, wherein $R1$ represents a radius of the display area, and $R2$ represents a distance between a center of the display area and an outer contour of the first assembly frame.

3. The display device according to claim 2, further comprising: a mirror cover plate at a side, facing away from the display panel, of the front plate;
    wherein the display device further comprises:
        a first optical film between the front plate and the display panel;
        a frame sealant connecting the front plate to the first optical film at an edge of a side, close to the display area, of the front plate; and
        an adhesive glue between the first optical film and the mirror cover plate in an area encircled by the front plate.

4. The display device according to claim 2, wherein the backplane further comprises: a plurality of first connectors that are integrally connected to the first side plates outside a joint of two adjacent first side plates;
    wherein the plurality of first connectors are configured for fixation to the assembly frame;
    wherein the first connector comprises a first connection portion parallel to a plane where the first bottom plate is located;
    the first connection portion comprises a first opening;
    the first assembly frame comprises first rivet studs corresponding to the first openings in a one-to-one manner; and
    the first rivet stud is fixed to the first connection portion through a first screw in an area of the first opening.

5. The display device according to claim 4, wherein the second assembly frame further comprises a second opening at least avoiding an opening of the first rivet stud.

6. The display device according to claim 4, wherein the first connection portion is connected to the first side plate.

7. The display device according to claim 4, wherein the first connector further comprises a second connection portion and a third connection portion;
    the third connection portion is connected to the first side plate;
    two ends of the second connection portion are connected to the third connection portion and the first connection portion respectively;
    the first connection portion is parallel to the third connection portion; and
    the second connection portion is parallel to the first side plate;
    wherein the third connection portion comprises a third opening;
    the second assembly frame comprises threaded openings corresponding to the third openings in a one-to-one manner; and
    the third connection portion is fixed to the second assembly frame through a second screw in an area of the third opening and the threaded opening.

8. The display device according to claim 4, wherein the first connector comprises:
   the first connection portion that is parallel to the plane where the first bottom plate is located and connected to the first side plate; and
   a first buckle at a side, close to the second assembly frame, of the first connection portion;
   wherein the second assembly frame comprises first buckling openings corresponding to the first buckles in a one-to-one manner; and
   the first buckle is buckled to the second assembly frame at the first buckling opening.

9. The display device according to claim 4, comprising a plurality of chip-on-film circuit boards, wherein the chip-on-film circuit boards are bent along the first side plates; and
   the first connectors are only connected to first side plates that do not correspond to a chip-on-film circuit board.

10. The display device according to claim 9, comprising K second printed circuit boards, wherein K is an integer greater than 1 and less than N, and N is a quantity of sides of the first bottom plate;
    wherein each of the second printed circuit boards is connected to at least one chip-on-film circuit board;
    each of the second printed circuit boards corresponds to one first side plate; and
    the backplane comprises N-K first connectors.

11. The display device according to claim 9, wherein the backplane further comprises: a plurality of second connectors connected to the first side plates corresponding to the chip-on-film circuit boards in an area other than bent areas of the chip-on-film circuit boards;
    wherein the plurality of second connectors are configured for fixation to the first assembly frame;
    wherein the second connector comprises: a fourth connection portion in bent connection to the first side plate, and a fifth connection portion connected to the fourth connection portion;
    the fifth connection portion has a fourth opening;
    the first assembly frame has second rivet studs that correspond to the fourth openings in a one-to-one manner and penetrate the fourth openings;
    in the fourth opening, the second rivet stud is fixed to the second connector through a third screw; and
    the second assembly frame has a fifth opening avoiding the second rivet stud.

12. The display device according to claim 1, wherein the display panel comprises a plurality of straight sides and a plurality of cambered sides;
    wherein the display device further comprises: a plurality of chip-on-film circuit boards bonded to the display panel at a portion, corresponding to at least part of the straight sides, of the peripheral area;
    wherein two chip-on-film circuit boards are bonded to the portion, corresponding to the at least part of the straight sides, of the peripheral area; or,
    only one chip-on-film circuit board is bonded to the portion, corresponding to the at least part of the straight sides, of the peripheral area.

13. The display device according to claim 12, wherein a quantity N of sides of the first bottom plate satisfies a condition as follows:

$$\tan^{-1}\left(\frac{nL3 + (n-1)L4}{2(R1+L1)}\right) \leq \frac{\pi}{N};$$

wherein N represents an integer rounded down, L3 represents a width of the chip-on-film circuit board in an extension direction of the straight side, n represents a quantity of chip-on-film circuit boards bonded to one straight side, and L4 represents a gap between adjacent chip-on-film circuit boards bonded to one straight side.

14. The display device according to claim 12, further comprising a plurality of second printed circuit boards bonded to the plurality of chip-on-film circuit boards;
    wherein the plurality of chip-on-film circuit boards penetrate a gap between the first assembly frame and the second assembly frame to bend towards a side, facing away from the display panel, of the backplane;
    the backplane has a plurality of first recesses recessed towards a side of the display panel, and the plurality of first recesses accommodate the plurality of second printed circuit boards;
    the display device further comprises cover members that cover the plurality of second printed circuit boards and the plurality of chip-on-film circuit boards at the side, facing away from the display panel, of the backplane;
    the second assembly frame comprises alignment marks corresponding to the cover members in a one-to-one manner; and
    the alignment mark comprises two alignment mark lines parallel to a pair of sides of the cover member respectively, and the pair of sides of the cover member overlap the alignment mark lines.

15. The display device according to claim 14, wherein the cover member is stuck to the second assembly frame and the backplane through an adhesive material; and
    a thickness of the adhesive material between the second assembly frame and the cover member is greater than a thickness of the adhesive material between the backplane and the cover member;
    wherein the adhesive material comprises:
    a first adhesive material stuck to the cover member; and
    a second adhesive material at a side, facing away from the cover member, of the first adhesive material;
    wherein the second adhesive material is at least stuck to the second assembly frame.

16. The display device according to claim 14, further comprising:
    a controller assembled to the backplane at the side, facing away from the display panel, of the backplane; and
    a plurality of flexible printed circuit boards;
    wherein an end of the flexible printed circuit board is connected to the controller, and an other end of the flexible printed circuit board is connected to the second printed circuit board; and
    the flexible printed circuit board is stuck to the backplane through a third adhesive material.

17. The display device according to claim 1, further comprising a plurality of converters;
    wherein each of the plurality of converters is electrically connected to even-numbered light strips.

18. The display device according to claim 17, comprising two converters;
    wherein the light strips correspond to the first side plates in a one-to-one manner, and a quantity N of sides of the first bottom plate is a multiple of 4.

19. The display device according to claim 1, wherein at a side facing away from the display panel, the first bottom plate further comprises:
    an annular protrusion;
    a pair of first strip-shaped protrusions arranged oppositely; and a pair of second strip-shaped protrusions arranged oppositely;

wherein a center of the annular protrusion coincides with a center of the display area, the first strip-shaped protrusions intersect with the second strip-shaped protrusions, the annular protrusion is located between the pair of first strip-shaped protrusions arranged oppositely, and the annular protrusion is located between the pair of second strip-shaped protrusions arranged oppositely;

wherein the display device further comprises:

an annular reinforcing rib at a side, facing away from the display panel, of the annular protrusion;

a first strip-shaped reinforcing rib at a side, facing away from the display panel, of the first strip-shaped protrusion; and a second strip-shaped reinforcing rib at a side, facing away from the display panel, of the second strip-shaped protrusion.

20. A display device, comprising:

a display panel, comprising a display area and a peripheral area surrounding the display area;

a backlight module at a light incident side of the display panel; wherein the backlight module comprises a backplane, a light guide plate and a plurality of light strips; the backplane comprises a polygonal first bottom plate, and a plurality of first side plates connected to the first bottom plate at an edge of the first bottom plate; the light guide plate is located between the first bottom plate and the display panel; and the plurality of light strips are located between the plurality of first side plates and the light guide plate; and an assembly frame, assembled to the display panel and the backlight module at an edge of the display panel and an edge of the backlight module; wherein a shape of an outer contour of the assembly frame is a circle;

wherein the assembly frame comprises:

a first assembly frame; wherein the first assembly frame comprises a front plate and a second side plate connected to the front plate at an edge of the front plate; the front plate covers part of the peripheral area at a side, facing away from the backlight module, of the display panel; and the second side plate is opposite to a side surface of the display panel and a side surface of the backlight module; and a second assembly frame; wherein the second assembly frame comprises a second bottom plate between the backlight module and the display panel, and a third side plate connected to the second bottom plate at an edge of the second bottom plate; and the third side plate is located between the second side plate and the first side plate in a connection area of two adjacent first side plates;

wherein a shape of the display area is a circle; and (R2−R1)/R1 is greater than or equal to 0.045 and less than or equal to 0.114, wherein R1 represents a radius of the display area, and R2 represents a distance between a center of the display area and an outer contour of the first assembly frame.

* * * * *